United States Patent [19]

Ruggieri

[11] Patent Number: 4,504,155

[45] Date of Patent: Mar. 12, 1985

[54] TIME-TO-VOLTAGE CONVERTER

[75] Inventor: Joseph A. Ruggieri, Altamonte Springs, Fla.

[73] Assignee: Chip Supply, Orlando, Fla.

[21] Appl. No.: 585,205

[22] Filed: Mar. 1, 1984

[51] Int. Cl.³ ............................................. G04F 8/00
[52] U.S. Cl. .................................................... 368/121
[58] Field of Search .............................. 368/113–123; 328/129.1, 130.1

[56] References Cited

U.S. PATENT DOCUMENTS

| | | | |
|---|---|---|---|
| 3,761,805 | 9/1973 | Dornberger | 368/121 X |
| 3,781,677 | 12/1973 | Hagen | 368/121 X |
| 3,790,890 | 2/1974 | Doittau et al. | 368/121 |
| 3,961,258 | 6/1976 | Morisaki | 368/121 |

FOREIGN PATENT DOCUMENTS

| | | | |
|---|---|---|---|
| 170565 | 3/1960 | Sweden | 368/121 |
| 176028 | 7/1961 | Sweden | 368/121 |

Primary Examiner—Vit W. Miska
Attorney, Agent, or Firm—Duckworth, Allen, Dyer & Pettis

[57] ABSTRACT

A constant current source is provided to charge a reference capacitor. The current is switched to the capacitor by a first high-speed analog switch when a first event occurs and the current is turned off by a second high-speed analog switch when a second event occurs. The voltage produced by the charge on the capacitor is proportional to the time between events. A sample and hold circuit maintains the maximum voltage on the capacitor when the events are periodic.

8 Claims, 6 Drawing Figures

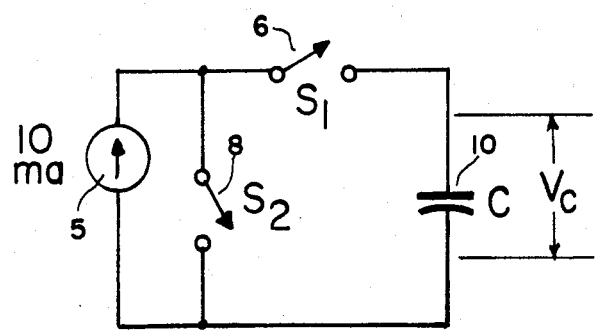
FIG. 1
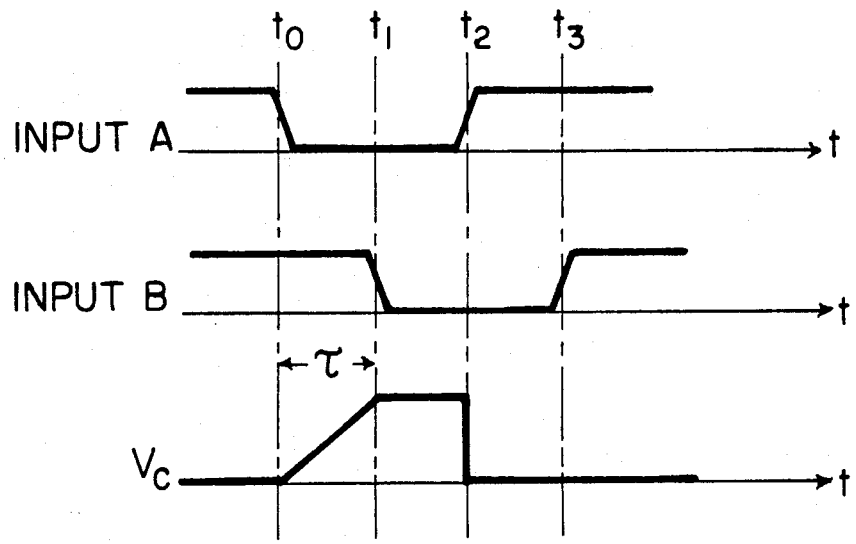
FIG. 2
FIG. 3
| t | $S_1$ | $S_2$ |
|---|---|---|
| $<t_0$ | CLOSED | CLOSED |
| $t_0$ | CLOSED | OPEN |
| $t_1$ | OPEN | OPEN |
| $t_2$ | CLOSED | CLOSED |

TIME-TO-VOLTAGE CONVERTER

BACKGROUND OF THE INVENTION

1. Field of the Invention

The present invention relates generally to circuits for measuring the time between two voltage transitions, and more particularly to a circuit for converting a time period to a dc voltage proportional to such period.

2. Description of the Prior Art

There are many requirements in the electronic art for obtaining quantitative measurements of time periods such as propagation delay, rise time, pulse widths, and periods of repetitive waveforms. A typical technique is described in U.S. Pat. No. 3,588,699 to Pysnik which measures the time between two signals utilizing voltage-controlled multivibrators. Janowitz et al in U.S. Pat. No. 3,999,128 teach the use of a comparator and sample and hold circuitry in driving a digital voltmeter. Other relevant U.S. patents are as follows: U.S. Pat. Nos. 3,461,392 to Hughes et al; 4,025,848 to Delagrange et al; 3,537,018 to Modiano; 4,246,497 to Lawsen et al; 3,940,693 to Brown; 3,787,765 to Morrow et al; and 3,805,153 to Gallant.

SUMMARY OF THE INVENTION

The present invention utilizes a constant current source to charge a reference capacitor via high speed analog switches. The current source is in series with first switch and the reference capacitor and in parallel with a second switch. When the first switch is closed and the second switch is open, the capacitor will accept a charge from the current source producing a linear voltage ramp across the capacitor proportional to the charging time.

When the second switch and first switch are closed, the capacitor will discharge. The analog switches may be controlled by two input signals. Assuming that both switches are closed and the capacitor is discharged, the second switch is opened and the first switch is closed by a first input signal permitting the capacitor to charge linearly. A second input signal opens the first switch and closes the second switch, diverting the constant current and leaving a charge on the capacitor. As may now be understood, the voltage across the capacitor is a measure of the length of time between the occurrence of the first and second input signals.

The capacitor voltage may be measured by means of a suitable voltmeter which may be calibrated in time increments.

In a preferred embodiment of the invention, the two inputs drive high-speed voltage comparators which control the analog switches. A high-input impedance voltage follower is connected across the capacitor to permit the voltage to be read out without excessive loading.

When periodic signals are applied to the inputs, both switches will close between signals, discharging the capacitor. A sample and hold circuit connected to the voltage follower may be used to hold the output voltage for measurement thereof.

It is therefore a principal object of the invention to provide a time to voltage converter for measuring time characteristics of electronic waveforms.

It is another object of the invention to provide a constant current source for charging a capacitor via switches controlled by electronic waveforms to be measured.

It is still another object of the invention to provide a time measurement circuit that can be implemented by an integrated circuit module.

These and other objects and advantages of the invention will become apparent from the following detailed description when read in conjunction with the drawings.

BRIEF DESCRIPTION OF THE DRAWINGS

FIG. 1 is a simplified equivalent circuit of a portion of the invention used to illustrate the principle thereof;

FIG. 2 is a set of waveform diagrams relating to FIG. 1;

FIG. 3 is a state table relating the waveforms of FIG. 2 to the circuit of FIG. 1;

DETAILED DESCRIPTION OF THE PREFERRED EMBODIMENT

Figure 4:
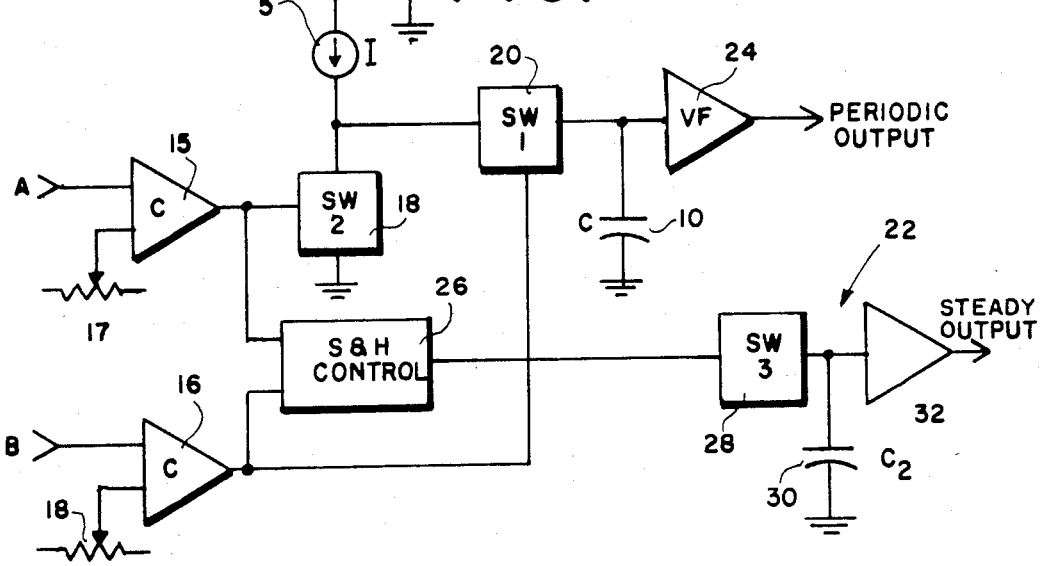
FIG. 4 is a block diagram of a preferred embodiment of the invention.

The principle of the time to voltage converter may be explained with reference to FIGS. 1 through 3. In FIG. 1 is shown an equivalent circuit diagram of the voltage generating portion of the invention having a constant current source 5 which may be 10 milliamps for exemplary purposes. Constant current source 5 is in series with reference capacitor 10 (C) and first switch 6 designated as $S_1$. A second switch 8 designated as $S_2$ is in parallel with constant current source 5.

The operation of the circuit of FIG. 1 may be understood with reference to FIG. 2 in which the time between the occurrence of two pulses is to be measured. The first waveform at input A is seen to have a transition at $t_0$ while a second waveform on input B has a transition at $t_1$. Prior to the occurrence of the transition on input A at $t_0$, it is assumed that first switch 6 and second switch 8 are both closed as indicated in the chart of FIG. 3. As will be described in more detail hereinafter, the invention includes means associated with second switch to cause it to open when the transition on input A occurs at $t_0$. Similarly, means are included associated with second switch 8 to cause it to close at a transition of the waveform on input B and with first switch 6 open at the transition such as indicated at $t_1$. Thus, at $t_0$, switch 6 ($S_1$) will be closed and switch 8 ($S_2$) will be open.

Assuming that a transition occurs in the waveform on input B $\tau$ seconds later at $t_1$, switch 6 opens and switch 8 closes. Therefore, capacitor 10 ceases to charge. As may be noted from waveform $V_c$, capacitor 10 starts charging at $t_0$, with voltage $V_c$ rising linearly to time $t_1$. $V_c$ thereafter will remain charged to a value $V_1$ until discharged.

At time $t_2$, a transition occurs in the waveform at A with the opposite polarity to the transition at $t_0$, causing switch 6 to close, discharging capacitor 10 through switches 6 and 8, causing $V_c$ to drop to zero.

As may now be understood, a first waveform occurring at input A will trigger comparator 15, causing current source 5 to start charging capacitor 10 via switch 20. A second, later waveform at input B triggers comparator 16, causing switch 20 to open. Capacitor 10 will hold the charge accumulated thereon between the time of occurrence of the first waveform and the time of occurrence of the second waveform. The voltage across capacitor 10 is applied to a high impedance input voltage follower 24 to produce an output to a suitable indicator.

If the inputs on A and B are periodic waveforms, the output will be a series of periodic pulses such as shown on line $V_c$ of FIG. 2. To be able to measure the voltage $V_1$, a sample and hold circuit 22 is provided. Sample and hold control circuit 26 is sensitive to the slope of the pulses on input A and B. High speed analog switch 28 is controlled to transfer the ouput from voltage follower 24 to capacitor 30 ($C_2$) which holds the charge after $V_1$ has dropped to zero, for example, at $t_2$. Voltage amplifier 32 isolates the voltage across capacitor 30 from the sample and hold output.

As will now be apparent, the time between $t_0$ and $t_1$ has been converted to a voltage $V_1$. As will be discussed below, the voltage $V_1$ can be sampled and held for operation of a voltmeter calibrated in time.

Assume that capacitor 10 in FIG. 1 has a capacity of 1000 pF, current source 5 produces 10 ma and a voltage of 1 volt occurs across capacitor 10. The time $\tau$ between $t_0$ and $t_1$ is:

$$\tau = \frac{V_1 C}{I}$$
$$= \frac{1 \times 1000 \times 10^{-12}}{10 \times 10^{-3}}$$
$$= 100 \times 10^{-9} \text{ seconds.}$$

Thus, in this example, the calibration is one nanosecond per 0.01 volts.

Turning now to FIG. 4, a block diagram of a preferred embodiment of the invention is shown suitable for measuring time intervals between a signal on input A and a signal on input B. The A signal is applied to an input of comparator 15. A threshold for triggering comparator 15 is set by control potentiometer 17. When the waveform on input A experiences a transition which exceeds the selected threshold, the logic level at the output of comparator 15 will change from ONE to ZERO or vice versa, depending upon the direction of the transition. The B signal drives comparator 16 having its threshold controlled by potentiometer 18. High speed analog switch 18 is opened by the logic level produced by triggering of comparator 15 and high speed analog switch 20 is similarly controlled by comparator 16. A constant current source 5 is provided to charge capacitor 10 when switch 20 is closed and switch 18 is open.

Figure 5:
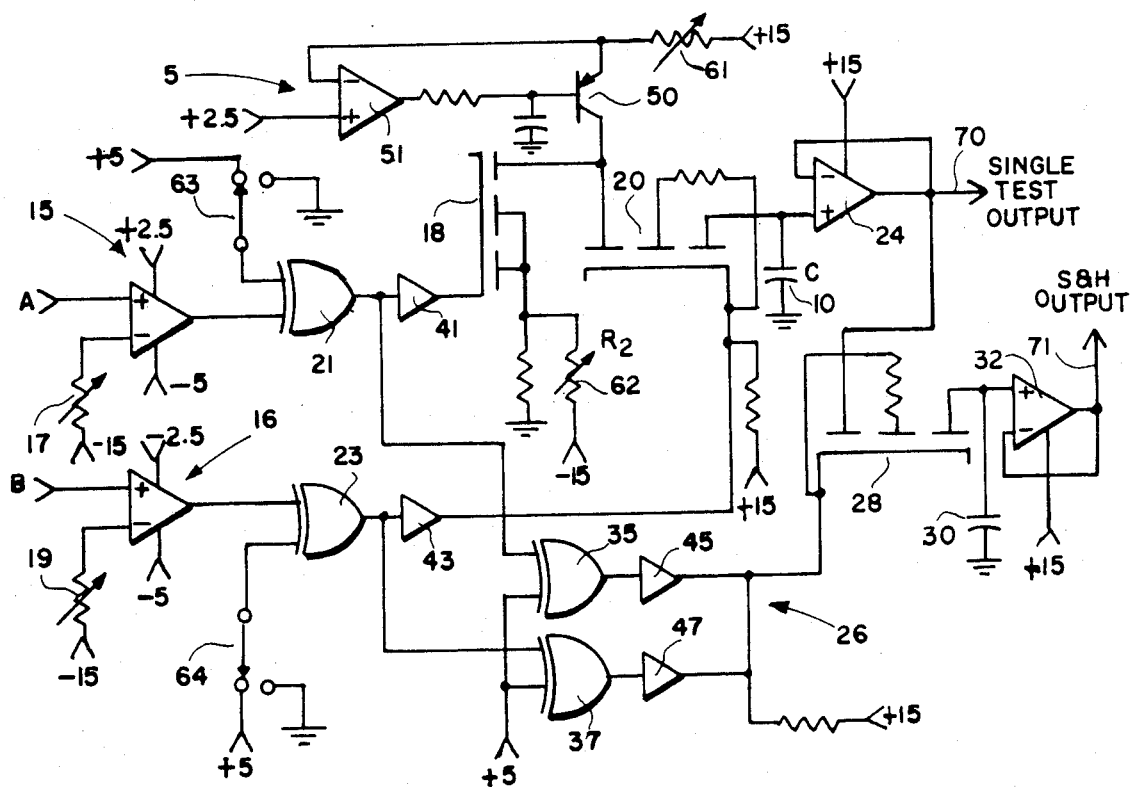
FIG. 5 is a more detailed schematic diagram of the circuit of FIG. 4.

In FIG. 5, a detailed schematic of the preferred embodiment of the invention is presented. Comparator 15 includes comparator amplifier 25 and exclusive OR gate 21. Comparator 15 may be a type NE527 and gate 21 may be a type 74F86. Similarly, comparator 16 includes comparator amplifier 27 and exclusive OR gate 23. Comparator 15 controls high speed analog switch 18 while comparator 16 controls switch 20. Switches 18 and 20 may be types SD214.

Constant current source 5 is implemented by transistor 50 which may be a type 2N2907 in which the base bias is regulated by regulator 51. Sample and hold control 26 utilizes an exclusive OR gate 35 driven from gate 21 and exclusive OR gate 37 driven from gate 23. Gates 35 and 37 may be types 74F86. These gates control high speed analog switch 28 which may be a type SD214. Voltage follower 24 is connected to capacitor 10 and voltage follower 32 is connected to sample and hold capacitor 30 and may be types CA3140.

As will be noted, comparator amplifiers 25 and 27 each have a negative bias. To select the slope of the signals on inputs A and B which will produce an enabling logic level to switches 18 and 20, excusive OR gates 21 and 23 are controlled by manual selector switches 63 and 64. As will be recognized, a negative-going transition of the waveforms on input A may produce either a ONE or a ZERO at the control electrode of switch 18, depending upon the setting of switch 63.

Figure 6:
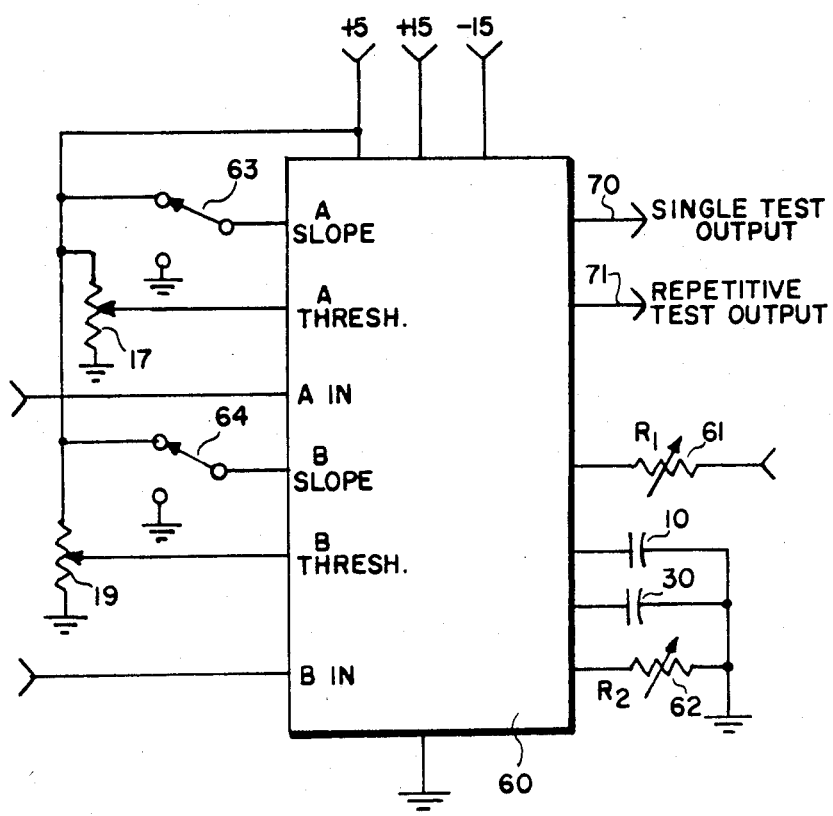
FIG. 6 is a schematic diagram of the invention implemented as an integrated circuit chip.

The various solid state integrated circuits or equivalents shown in FIG. 5 are available as chips. By assembling such chips on a substrate 60, an LSI circuit shown in FIG. 6 may be fabricated. As will be noted, constant current adjustment 61 ($R_1$) is outboard of LSI circuit 60 to permit calibration of the output signal. Similarly, logic level adjustment 62 ($R_2$) is external to permit setting of the turn-on level of switch 18. Slope selector switches 63 and 64 are outboard of substrate 60 as are threshold controls 17 and 19. Advantageously, the LSI circuit may be made available to the industry for inclusion in a wide variety of instruments and electronic devices where measurements of time intervals or control related to time intervals are required.

Although the invention has been disclosed with reference to a specific circuit and preferred components, it will be obvious to those of skill in the art to make various changes and substitutions without departing from the spirit and scope of the invention.

I claim:

1. A converter for converting a time interval to a measurement voltage proportional thereto comprising:
   an essentially constant current source;
   a first switch having a first terminal thereof connected to said current source;
   a second switch connected in parallel with said current source;
   a capacitor connected to a second terminal of said first switch and to said current source in a manner to permit said capacitor charge linearly with time only when said first switch is closed and said second switch is open, and to permit said capacitor to discharge only when said first switch and said switch are closed;
   first event detection means for detecting a first event occurring when said first and second switches are closed, said first event detection means including first control means connected to said second switch for opening said second switch when said first event is detected thereby permitting said capacitor to charge; and
   second event detection means for detecting a second event occurring after said first event while said capacitor is charging, said second event detection means including second control means connected to said first switch for opening said first switch when said second event is detected thereby providing said measurement voltage on said capacitor directly proportional to the time interval between the occurrences of said first and second events.

2. The converter as defined in claim 1 in which said first and second switches are each a high-speed analog electronic switch, each of said switches having a control signal input.

3. The converter as defined in claim 2 in which:

said first event detection means includes a first comparator means for producing a signal on its output due to a first transition of a first waveform, said output operatively connected to said second switch for controlling said second switch to open; and said second event detection means includes a second comparator means for producing a second control signal on its output due to a first transition of a second waveform, said output operatively connected to said first switch for controlling said second switch to open.

4. The converter as defined in claim 1 which further comprises a voltage follower having its input connected to said capacitor.

5. The converter as defined in claim 1 in which said first detection means and said second event detection means each include means for detecting the occurrence of a waveform transition.

6. The converter as defined in claim 5 in which said waveform transition means include selection means for selecting detection of positive-going or negative-going transitions.

7. The converter as defined in claim 3 in which:
said first comparator means produces a third control signal on its output due to a second transition of said first waveform, said third control signal controlling said second switch to close; and said second comparator means produces a fourth control signal on its output due to a second transition of said second waveform, said fourth control signal controlling said first switch to close.

8. The converter as defined in claim 7 which further comprises sample and hold means connected to said capacitor, said sample and hold means for producing a steady output voltage when said measurement voltage is periodic.

* * * * *